(12) United States Patent
Nagai et al.

(10) Patent No.: US 6,366,310 B1
(45) Date of Patent: Apr. 2, 2002

(54) ELECTRONIC PARTS MOUNTING APPARATUS

(75) Inventors: Yoshiyuki Nagai, Toyonaka; Ryoji Inutsuka, Osaka; Kunio Ohe, Hirakata; Hideo Sakon, Takatsuki; Koichi Yabuki; Kazuhiro Murata, both of Nara, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/029,097

(22) PCT Filed: Jun. 19, 1997

(86) PCT No.: PCT/JP97/02123

§ 371 Date: Mar. 17, 1998

§ 102(e) Date: Mar. 17, 1998

(87) PCT Pub. No.: WO97/49273

PCT Pub. Date: Dec. 24, 1997

(30) Foreign Application Priority Data

Jun. 20, 1996 (JP) .............................. 8-158727

(51) Int. Cl.$^7$ ................................ H04N 7/18
(52) U.S. Cl. ..................... 348/87; 348/126; 382/151
(58) Field of Search ........................ 348/86–87, 91, 348/94–95, 125–126, 133–134; 29/739–743; 382/141, 145, 151, 216, 287–288, 291; 702/94, 150–15

(56) References Cited

U.S. PATENT DOCUMENTS

| | | | | |
|---|---|---|---|---|
| 5,237,622 A | * | 8/1993 | Howell ........................ | 382/151 |
| 5,519,495 A | * | 5/1996 | Kawaguchi .................. | 356/375 |
| 5,541,834 A | * | 7/1996 | Tomigashi et al. ..... | 364/167.05 |
| 5,627,913 A | * | 5/1997 | Spigarelli et al. ........... | 382/151 |
| 5,667,129 A | * | 9/1997 | Morita et al. ............... | 228/102 |
| 5,850,252 A | * | 12/1998 | Miyata ........................ | 348/87 |
| 5,854,745 A | * | 12/1998 | Muraoka et al. ........ | 364/167.04 |

* cited by examiner

*Primary Examiner*—Vu Le
(74) *Attorney, Agent, or Firm*—Parkhurst & Wendel, L.L.P.

(57) ABSTRACT

An electronic parts mounting apparatus for divisionally recognizing an electronic part (2) even when the apparatus is arranged in such that the relative positional relation between a recognition camera (4) and a nozzle (1) cannot be varied. The electronic part (2) is vacuum-clamped by a nozzle (1), the posture of the nozzle (1) or the posture of the electronic part (2) is changed a plurality of times by a rotary driving member (3), and a part of the electronic part (2) imaged by the recognition camera (4) every time the posture of the electronic part (2) is changed, whereby the part is recognized. Thus, the recognition of the contour of the electronic part (2) becomes possible, and the electronic part can be mounted accurately on a circuit board by making a positional correction on the basis of the amount of deviation obtained.

10 Claims, 9 Drawing Sheets

ELECTRONIC PARTS MOUNTING APPARATUS

TECHNICAL FIELD

The present invention relates to an electronic parts mounting apparatus for mounting electronic parts on a circuit board.

BACKGROUND ART

Recently, as electronic circuit boards become more and more highly dense and functional, and integrated electronic parts become larger and larger in size, high accuracy is demanded for an electronic parts mounting apparatus. Thus, it becomes necessary to mount the electronic parts on the electronic circuit board by accurately recognizing them and correcting their positions. In this case, since a visual field size is selected for a recognition camera from required mounting accuracy, divisional recognition means is employed to recognize an electronic part larger than the visual field size.

Now, explanation is given on an example of operation for recognizing an electronic part in an electronic parts mounting apparatus with reference to the drawings.

Figure 9A:
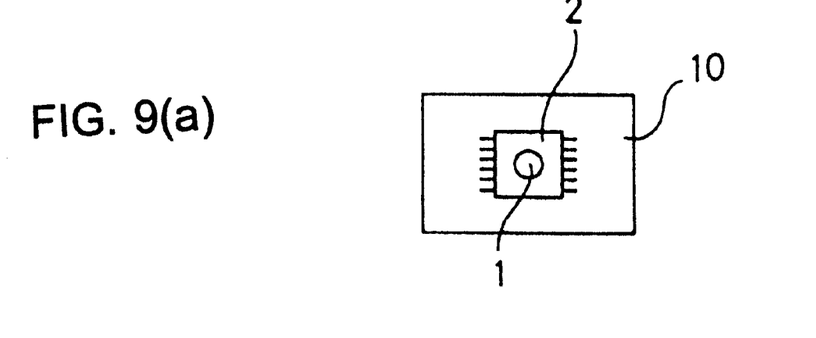
FIGS. 9(a)–(b) are diagrams for illustrating operation of the part recognition mechanism of the above electronic parts mounting apparatus.

FIG. 9(a) shows a relationship between a visual field 10 of a recognition camera, an electronic part 2, and a nozzle 1 for holding the electronic part 2. When the electronic part 2 is smaller than the visual field of camera 10, as shown, the electronic part 2 can be recognized by aligning the position of the nozzle 1 at the center of visual field.

Figure 9B:
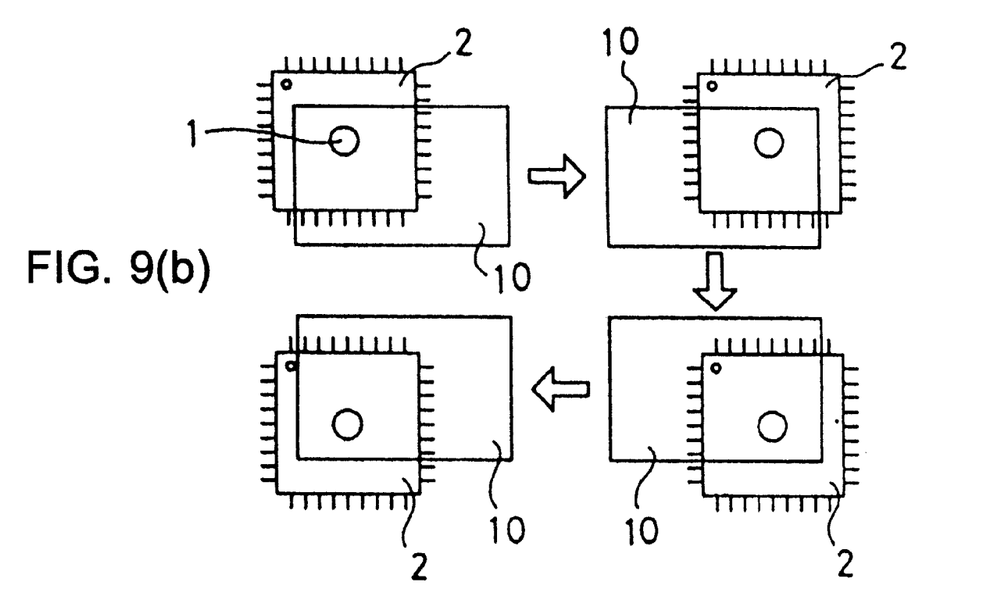

FIG. 9(b) shows a case where the electronic part 2 is larger than the visual field of camera 10. In this case, to recognize the electronic part 2, it is necessary to perform divisional recognition by varying the relative positional relationship between the nozzle 1 and the visual field of camera 10 as indicated by arrow.

As described, it is necessary to perform the divisional recognition to recognize the electronic part 2 larger than the visual field of camera 10. However, to vary the relative positional relationship between the nozzle 1 and the visual field of camera 10, it should be arranged that the nozzle 1 or the camera (visual field 10) can freely move on a plane opposite to the electronic part 2. Thus, there is a problem that the divisional recognition of the electronic part cannot be performed on an electronic parts mounting apparatus on which the relative positional relationship between the nozzle 1 and the camera cannot be varied.

In addition, the method performing divisional recognition by varying the relative positional relationship between the nozzle 1 and the visual field of camera 10 has a problem that it takes more time than the method performing recognition with a single visual field because the former captures images a plurality of times.

DISCLOSURE OF THE INVENTION

The present invention is intended to provide an electronic parts mounting apparatus which enables it to perform divisional recognition of an electronic part even when a relative positional relationship between a nozzle and a camera is not varied, and which can use the divisional recognition and single visual field recognition in combination, so that recognition is performed in a single visual field for an electronic part which can be recognized in a single visual field, enabling the time of recognition to be shortened.

To attain the above object, the electronic parts mounting apparatus of the present invention comprises a nozzle for holding an electronic part, a rotary driving member for rotating and driving the nozzle in a desired angle, a recognition camera for imaging the electronic part held by the nozzle, and part recognition means for changing a plurality of times the posture of the electronic part held by the nozzle with the rotary driving member when the center of the visual field of the recognition camera is positioned at a position different from the center of rotation of the nozzle, and recognizing the electronic part from partial recognition images obtained from the recognition camera every time the posture is changed.

According to the present invention, it is possible to obtain an electronic parts mounting apparatus enabling it to perform divisional recognition of an electronic part even when the relative positional relationship between the nozzle and the camera is not varied.

An electronic parts mounting apparatus according to a first aspect of the present invention comprises a nozzle for holding an electronic part, a rotary driving member for rotating and driving the nozzle in a desired angle, a recognition camera for imaging the electronic part held by the nozzle, and part recognition means for changing a plurality of times the posture of the electronic part held by the nozzle with the rotary driving member when the center of the visual field of the recognition camera is positioned at a position different from the center of rotation of the nozzle, and recognizing the electronic part from partial recognition images obtained from the recognition camera every time the posture is changed.

Thus, there is an advantage that even an electronic parts mounting apparatus arranged not to be capable of varying the positional relationship between the recognition camera and the electronic part to be recognized can recognize the contour of the electronic part by changing the posture of the electronic part a plurality of times with the rotary driving member, and capturing a partial image every time the posture is changed to recognize the contour of the electronic part.

An electronic parts mounting apparatus according to a second aspect of the present invention comprises a nozzle for holding an electronic part, a rotary driving member for rotating and driving the nozzle in a desired angle, a first recognition camera positioned with the center of its visual field at a position coincident with the center of rotation of the nozzle, and for imaging the electronic part held by the nozzle, a second recognition camera positioned with the center of its visual field at a position different from the center of rotation of the nozzle, and for imaging the electronic part held by the nozzle, and part recognition means, when recognizing an electronic part smaller than the visual field size of the camera, for batch recognizing the electronic part from a recognized image of the electronic part obtained from the first recognition camera, and, when recognizing an electronic part larger than the visual field size of the camera, for changing a plurality of times the posture of the electronic part held by the nozzle with the rotary driving member, and recognizing the electronic part from partial recognized images obtained from the second camera every time the posture is changed.

As the first recognition camera the center of visual field of which aligns the center of rotation of the nozzle is used for a small electronic parts which can be recognized with a single visual field, and the second recognition camera the center of visual field of which differs from the center of rotation of the nozzle is used for a large electronic part, there is provided an advantage that batch recognition and divisional recognition can be used in combination for recognizing an electronic part without varying the relative positional relationship between the nozzle and the first and second recognition cameras, so that time for recognition can be shortened.

An electronic parts mounting apparatus according to a third aspect of the present invention a nozzle for holding an electronic part, a rotary driving member for rotating and driving the nozzle in a desired angle, a recognition camera for imaging the electronic part held by the nozzle, a driving mechanism for varying the relative positional relationship between the center of visual field of the recognition camera and the center of rotation of the nozzle, and part recognition means, when recognizing an electronic part smaller than the visual field size of camera, for batch recognizing the electronic part from a recognized image of the electronic part obtained from the recognition camera by aligning the center of visual field of the recognition camera with the center of rotation of the nozzle with the driving mechanism, and, when recognizing an electronic part larger than the visual field size of the camera, for changing a plurality of times the posture of the electronic part held by the nozzle with the rotary driving member, and recognizing the electronic part from partial recognized images of the electronic part obtained from the camera every time the posture is changed.

There is provided an advantage that batch recognition and divisional recognition can be used in combination for recognizing an electronic part by varying the relative positional relationship between the recognition camera and the electronic part with the driving mechanism, so that the time for recognition can be shortened.

An electronic parts mounting apparatus according to a fourth aspect of the present invention is a one according to the third aspect of the present invention, wherein, when either one of the center of visual field of the recognition camera and the center of rotation of the nozzle is determined to be a reference for the driving mechanism, its driving direction is limited to one fixed direction.

This arrangements provide an advantage that the driving mechanism can be simplified.

An electronic parts mounting apparatus according to a fifth aspect of the present invention is one according to the third aspect of the present invention, further comprising calculation means for calculating a location for movement of the recognition camera from previously registered data on the center of rotation of the nozzle, the driving mechanism moving the recognition camera to the location for movement calculated by the calculation means.

There is provided an advantage that divisional recognition can be performed even when the center of rotation data of the nozzle is varied.

An electronic parts mounting apparatus according to a sixth aspect of the present invention is one according to the third aspect of the present invention, further comprising calculation means for calculating a location for movement of the recognition camera from previously registered sizes of electronic parts, the driving mechanism moving the recognition camera to the location for movement calculated by the calculation means.

There is provided an advantage that divisional recognition can be performed even when the outer size of an electronic part is varied.

BEST MODE FOR CARRYING OUT THE INVENTION

Embodiment 1

Figure 1:
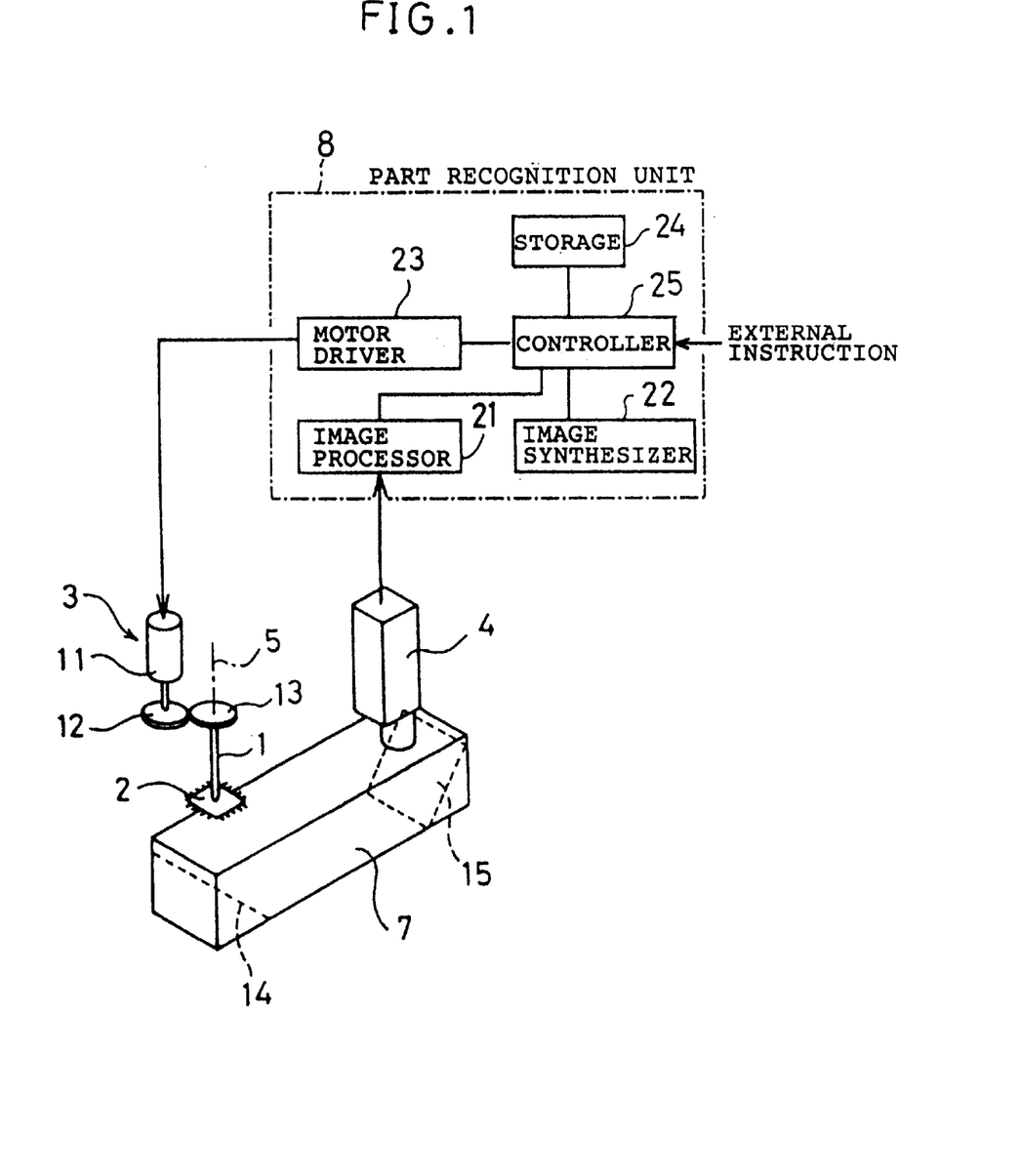
FIG. 1 is an arrangement of a part recognition mechanism of an electronic parts mounting apparatus according to embodiment 1 of the present invention.

FIG. 1 is an arrangement of a part recognition mechanism of an electronic parts mounting apparatus according to embodiment 1 of the present invention.

Referring to FIG. 1, there is shown a nozzle 1 for sucking and holding an electronic part 2, the nozzle 1 being rotatable in any desired angle by a rotary driving member 3. In the figure, the rotary driving member 3 comprises a pulse motor 11, a first gear 12 coupled to the rotating shaft of the motor 11, and a second gear 13 rotating around the center of rotation 5 of the nozzle 1 and meshing the first gear. An AC servo motor may be used in place of the pulse motor 11.

Also in FIG. 1, there is shown a mirror assembly 7 constituted by oppositely arranging two mirrors 14 and 15, the mirror 14 being disposed to face the bottom of the electronic part 2, so that an image of the electronic part 2 can be viewed from above with the other mirror 15. A recognition camera 4 is disposed over the other mirror 15 by offsetting the center of rotation 5 of the nozzle 1 from the center of visual field 6, as shown in FIG. 2.

A signal of an image imaged by the recognition camera 4 is input into a part recognition unit 8. The part recognition unit 8 comprises an image processor 21 for recognizing the image of the electronic part 2 with the input image signal, an image synthesizer 22 for synthesizing a plurality of partial images recognized by the image processor 21, a motor driver 23 for rotationally changing the posture of the nozzle 1, or the posture of the electronic part 2 by outputting a rotationally driving signal to the pulse motor 11 in the rotary driving member 3, a storage 24 for storing data of the partial images or the like, and a controller 25 for generally controlling the image processor 21, the image synthesizer 22, the motor driver 23 and the storage 24 in response to a part recognition instruction signal from a controller (not shown) of the electronic parts mounting apparatus.

The operation of the part recognition mechanism with the above arrangement is described with reference to FIGS. 2(a)–(d).

Step-1

Figure 2A:
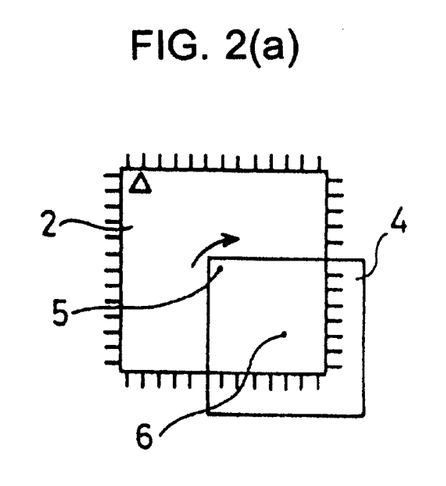
FIGS. 2(a)–(d) are diagrams for illustrating operation of the part recognition mechanism of the above electronic parts mounting apparatus.

When a part recognition instruction signal is input, the controller 25 drives and causes the image processor 21 to recognize partial images of the electronic part 2 with the image signal imaged by the recognition camera 4, and then stores partial image data in the storage 24.

Step-2

Figure 2B:
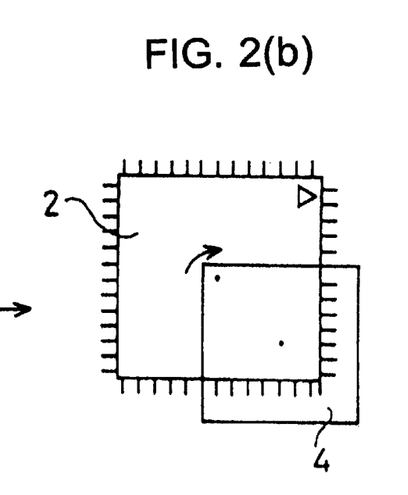

Then, the controller 25 drives the rotary drive section 3 to rotate the posture of the nozzle 1, or the posture of the electronic part 2 by 90°, for example, as shown in FIG. 2(b).

Figure 2C:
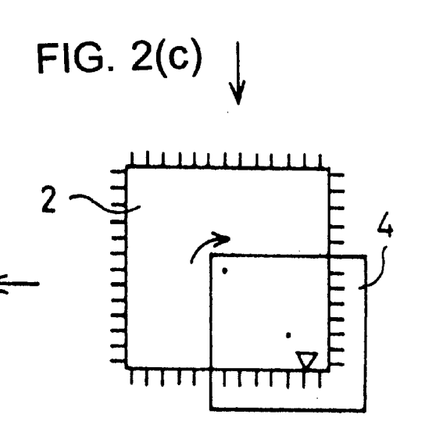
Figure 2D:
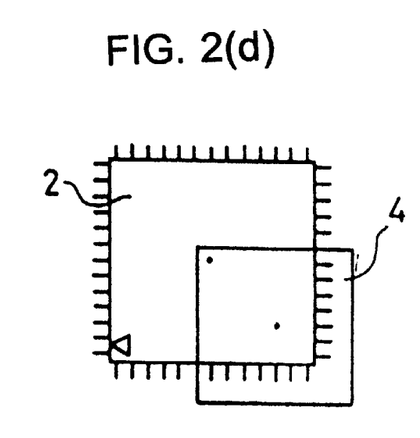

Steps-1 and -2 are repeated FIGS. 2(c) and (d).

Step-3

When the posture or nozzle 1 or electronic part 2 is changed three times according to Step-2, and recognition of the partial images of the electronic part 2 according to Step-1 completes four times, the partial image data stored in the storage 24 is output to the image synthesizer 22, whereby an image of the entire electronic part 2 is recognized.

Step-4

Amount of offset is determined and output between the center of the recognized electronic part 2 and the center of rotation 5 of the nozzle 1.

Thus, the contour of the electronic part 2 can be recognized by changing the posture of the nozzle 1 or the electronic part 2 a plurality of times with the rotary driving member 3, capturing partial images every time the posture is changed, and performing partial recognition. Then, the electronic part 2 can be precisely and accurately mounted on a circuit board by correcting the position when mounting the electronic part based on amount of deviation obtained.

Embodiment 2

Figure 3:
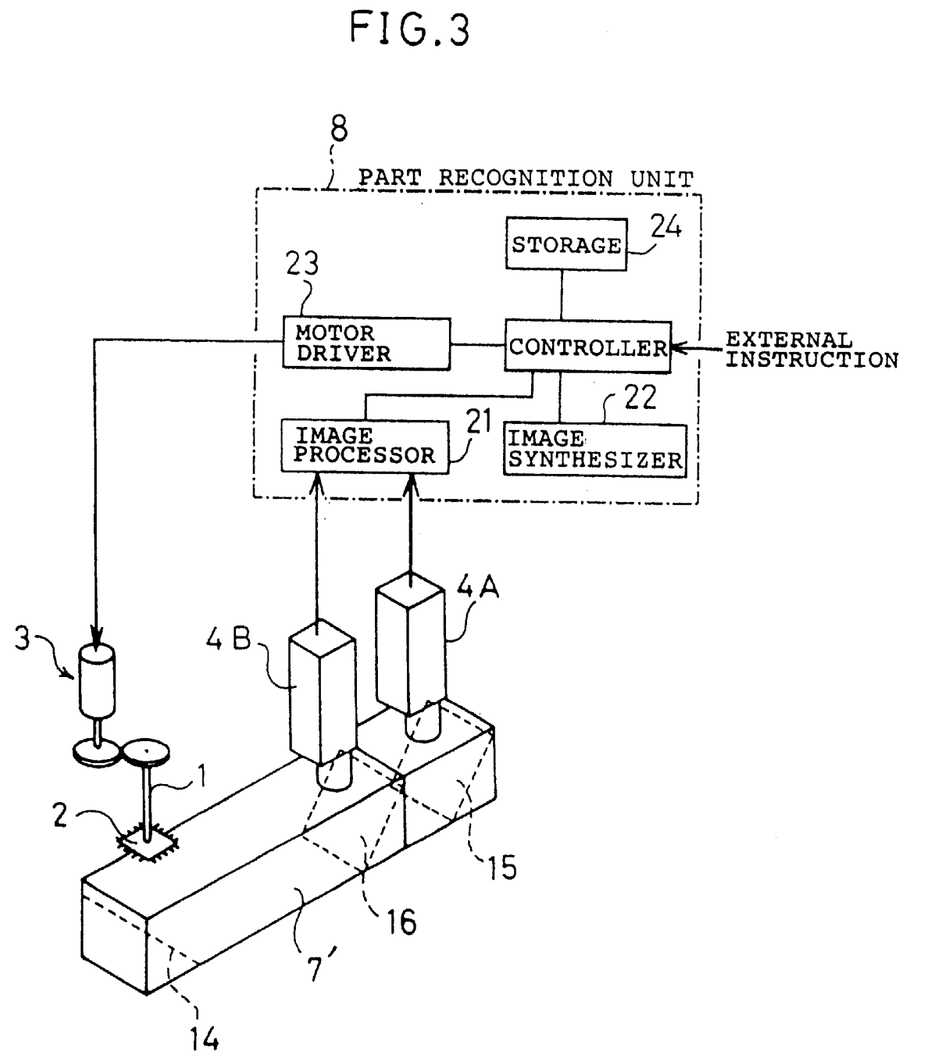
FIG. 3 is an arrangement of a part recognition mechanism of an electronic parts mounting apparatus according to embodiment 2 of the present invention.

FIG. 3 is an arrangement of a part recognition mechanism of an electronic parts mounting apparatus according to embodiment 2 of the present invention. Components similar to those of the above embodiment 1 are designated by the same reference numerals, and omitted for their description.

Figure 4:
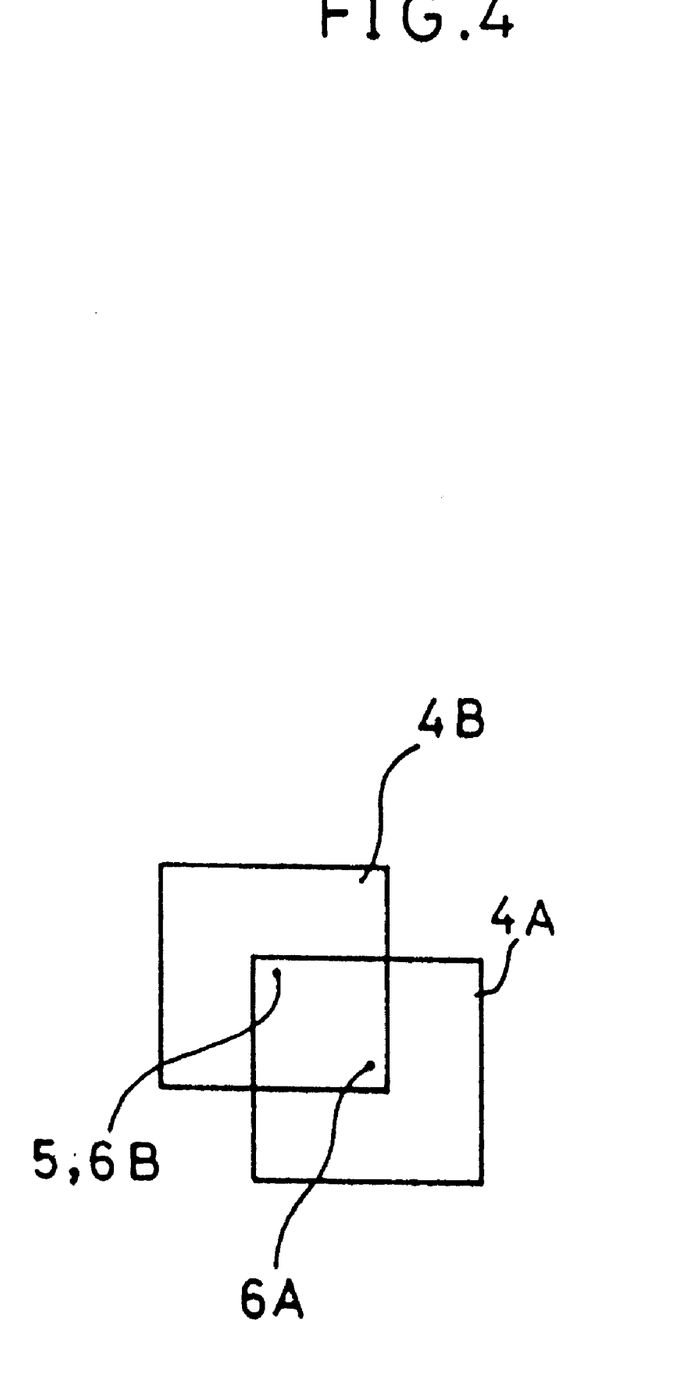
FIG. 4 is a diagram for illustrating operation of the part recognition mechanism of the above electronic parts mounting apparatus.

A mirror assembly 7' is provided with a half-mirror 16 in addition to two mirrors 14 and 15. This arrangement means that an image of the electronic part 2 can be viewed from the above also by the half-mirror 16. A second recognition camera 4B is disposed at a position over the half-mirror 16 of the mirror assembly 7', with its center of visual field being offset from that of a first recognition camera 4A, as shown in FIG. 4. The center of visual field 6A of the recognition camera 4A is offset from the center of rotation 5 of the nozzle, while the center of visual field 6B of the recognition camera 4B aligns the center of rotation 5 of the nozzle.

With the above arrangement, when the controller 25 of the part recognition unit 8 recognizes an electronic part 2 smaller than the visual field of the recognition camera under a part recognition instruction signal, it inputs an image signal from the recognition camera 4B into the image processor 21, thereby performing batch recognition, and when it recognizes an electronic part larger than the visual field of the recognition camera under a part recognition instruction signal, it inputs an image signal from the recognition camera 4A into the image processor 21, whereby the posture of the nozzle 1 or the electronic part 2 is rotationally changed by the rotary driving member 3 as in the above embodiment 1 to capture images a plurality of times for divisional recognition of the electronic part 2.

Thus, single-visual field recognition and multi-visual field divisional recognition can be performed without changing the relative positional relationship between the nozzle 1 and the recognition cameras 4A, 4B. Then, the camera 4B in which the center of its visual field aligns the center of rotation of the nozzle is used for a small electronic part 2 which can be recognized with a single visual field, while the recognition camera 4A in which the center of its visual field is offset from the center of rotation of the nozzle is used for a large electronic part, so that the time of recognition can be shortened.

Embodiment 3

Figure 5:
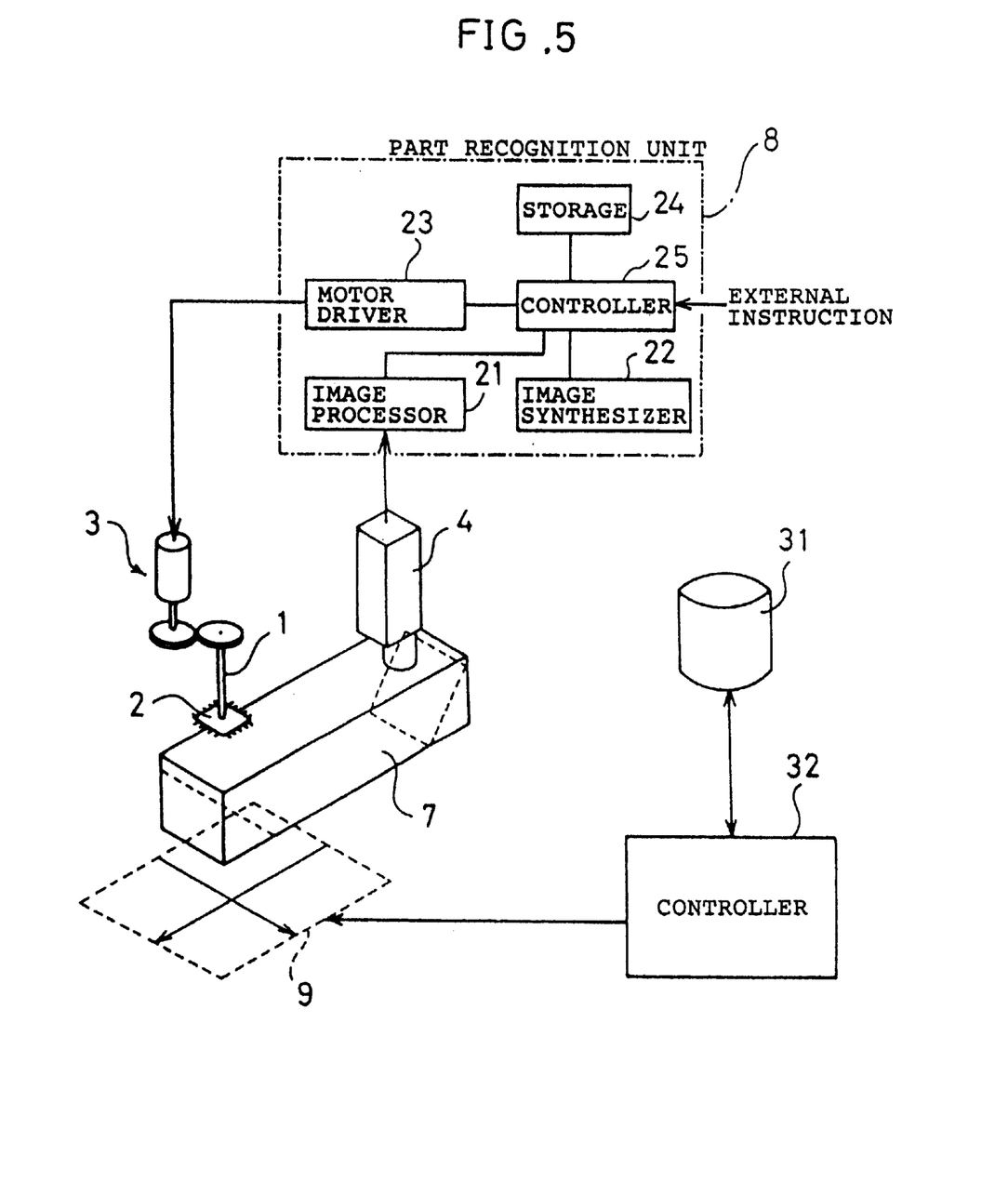
FIG. 5 is an arrangement of a part recognition mechanism of an electronic parts mounting apparatus according to embodiment 3 of the present invention.

FIG. 5 is an arrangement of a part recognition mechanism of an electronic parts mounting apparatus according to embodiment 3 of the present invention. Components similar to those of the above embodiment 1 are designated by the same reference numerals, and omitted for their description.

Referring to FIG. 5, there is shown an XY table (driving mechanism) 9 which makes the mirror assembly 7 and the recognition camera 4 movable relative to the electronic part 2. The relative positional relationship between the recognition camera 4 and the nozzle 1 or the electronic part 2 can be varied by driving the XY table 9. The XY table 9 is driven by an actuator such as an AC servo motor. The nozzle 1 and the rotary driving member 3 may be contrarily made movable by the XY table 9.

Furthermore, in FIG. 5, there is shown a storage 31 previously storing position data of the center of rotation of the nozzle 1 and electronic part sizes, and a controller 32 for the XY table 9 for calculating the positional relationship between the center of rotation 5 of the nozzle and the center of visual field 6 of the camera using the position data of the center of rotation of the nozzle and the electronic part sizes stored in the storage to drive the XY table 9.

Figure 6A:
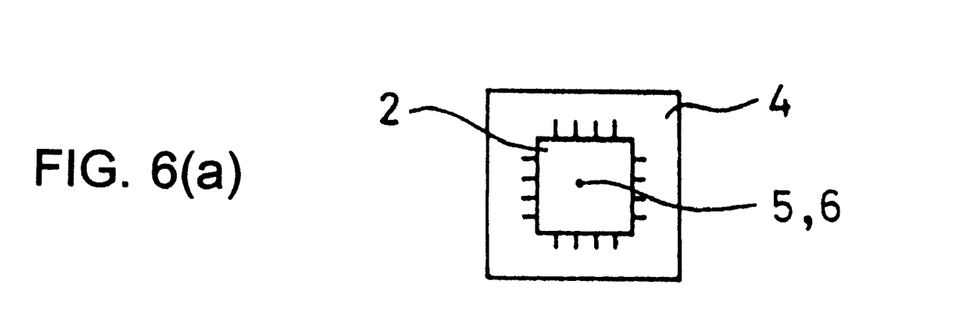
FIGS. 6(a)–(b) are diagrams for illustrating operation of the part recognition mechanism of the above electronic parts mounting apparatus.
Figure 6B:
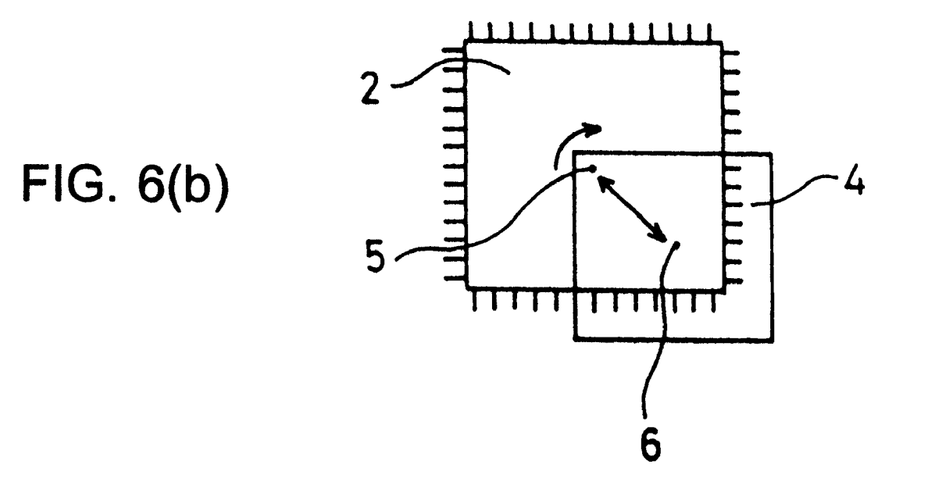

With the above arrangement, when an electronic part 2 smaller than the visual field of the recognition camera is recognized by using the controller 32 for the XY table 9, the XY table 9 is driven in such that, as shown in FIG. 6(a), the center of recognition visual field 6 aligns the center of rotation 5 of the nozzle. When an electronic part 2 larger than the visual field of the recognition camera is recognized, the XY table 9 is driven such that, as shown in FIG. 6(b), the center of visual field 6 of the camera is offset from the center of rotation of the nozzle, so that a part of the electronic part 2 enters in the visual field of the camera. The part recognition method with the part recognition unit 8 is similar to the above embodiment. Then, when an electronic part 2 smaller than the visual field of the recognition camera is recognized, it is batch recognized, while, when an electronic part larger than the visual field of the recognition camera, partial images are captured a plurality of times for divisional recognition of the electronic part 2 by changing the posture of the nozzle 1 or the electronic part 2 by the rotary driving member 3.

In this way, batch recognition and divisional recognition can be simultaneously employed by varying the relative positional relationship between the recognition camera 4 and the nozzle 1 or the electronic part 2 with the XY table 9.

In this case, since the size of visual field of the camera should be effectively used, in performing the divisional recognition, the position of the nozzle relative to the visual field of recognition is on a straight line extending from the center of visual field 6 toward a corner of the visual field as shown in FIG. 6(b). To this end, it may be one direction to vary the center of rotation 5 of the nozzle and the center of visual field 6 of the camera. In this case, the XY table 9 can be of a simple structure, so that cost can be reduced.

Description is given on calculation of the positional relationship between the center position of rotation 5 of the nozzle and the center of visual field 6 of the camera, and driving of the XY table 9 by the controller 32 for the XY table 9.

Figure 7:
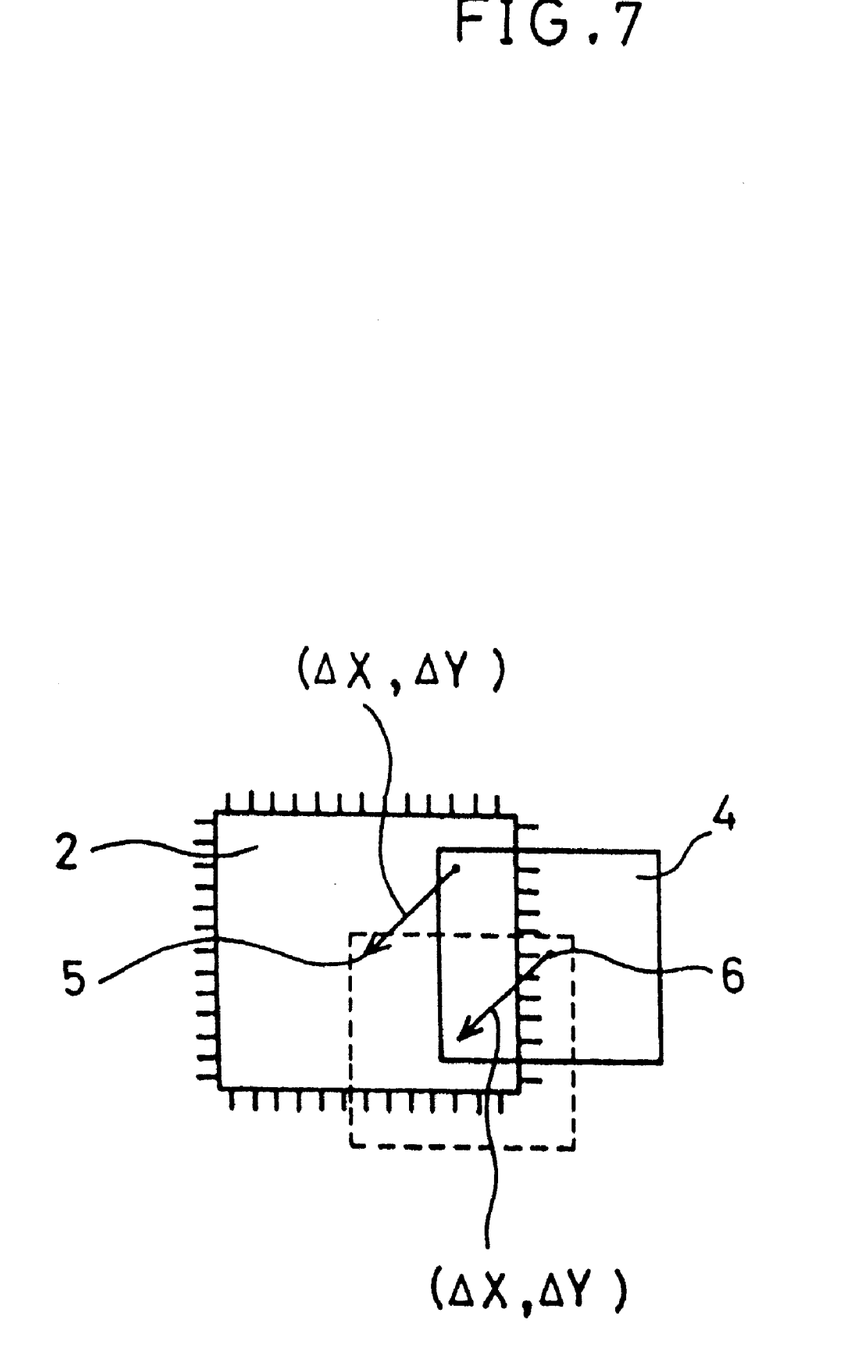
FIG. 7 is a diagram for illustrating operation of the part recognition mechanism of the above electronic parts mounting apparatus.

FIG. 7 shows an operation when the center position of rotation 5 of the nozzle is varied.

When the position of nozzle 5 is varied by ($\Delta X$, $\Delta Y$), the electronic part 2 cannot be contained in the visual field of camera and divisional recognition is impossible. In this case, the divisional recognition can be performed for the electronic part 2 by varying the positional relationship between the center of rotation 5 of the nozzle and the center of visual field 6 of the camera by ($\Delta X$, $\Delta Y$) with the XY table 9.

Figure 8:
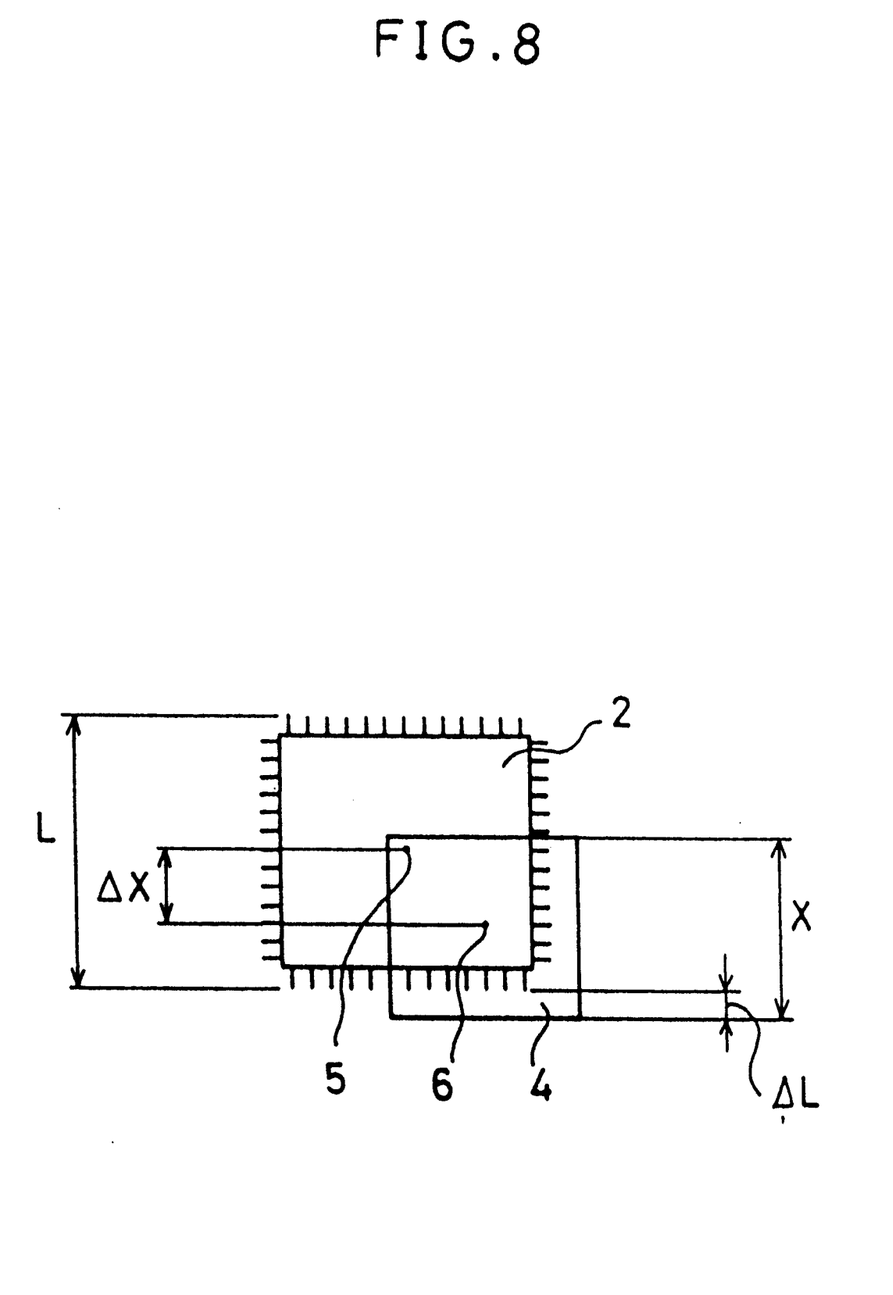
FIG. 8 is a diagram for illustrating operation of the part recognition mechanism of the above electronic parts mounting apparatus.

Then, FIG. 8 shows an operation when the size of electronic part is varied.

When it is assumed that the size of visual field of recognition camera is X, the outer size of electronic part is L, and margin for displacement of the electronic part or the like is $\Delta L$, the relative position $\Delta X$ between the center of nozzle 5 and the center of visual field 6 of the camera is sufficient to be in a positional relationship calculated by:

$$\Delta X = (L + 2\Delta L - X)/2$$

Thus, the divisional recognition can be performed even when the size of electronic part is varied.

What is claimed is:

1. An electronic parts mounting apparatus comprising:
   a nozzle for holding an electronic part,
   a rotary driving member for rotating and driving said nozzle in a desired angle,
   a recognition camera for imaging the electronic part held by said nozzle, and
   part recognition means for changing a plurality of times the posture of the electronic part held by said nozzle with said rotary driving member when the center of the visual field of said recognition camera is positioned at a position different from the center of rotation of said nozzle, and recognizing the electronic part from partial recognition images obtained from said recognition camera every time the posture is changed.

2. An electronic parts mounting apparatus comprising:
   a nozzle for holding an electronic part,
   a rotary driving member for rotating and driving said nozzle in a desired angle,
   a first recognition camera positioned with the center of its visual field at a position coincident with the center of rotation of said nozzle, and for imaging the electronic part held by the nozzle,
   a second recognition camera positioned with the center of its visual field at a position different from the center of rotation of said nozzle, and for imaging the electronic part held by the nozzle, and
   part recognition means, when recognizing an electronic part smaller than the visual field size of camera, for batch recognizing the electronic part from a recognized image of said electronic part obtained from said first recognition camera, and, when recognizing an electronic part larger than the visual field size of camera, for changing a plurality of times the posture of the electronic part held by said nozzle with said rotary driving member, and recognizing the electronic part from partial recognized images obtained from said second camera every time the posture is changed.

3. An electronic parts mounting apparatus comprising:
   a nozzle for holding an electronic part,
   a rotary driving member for rotating and driving said nozzle in a desired angle,
   a recognition camera for imaging the electronic part held by said nozzle,
   a driving mechanism for varying the relative positional relationship between the center of visual field of said recognition camera and the center of rotation of said nozzle, and
   part recognition means, when recognizing an electronic part smaller than the visual field size of camera, for batch recognizing the electronic part from a recognized image of said electronic part obtained from said recognition camera by aligning the center of visual field of said recognition camera with the center of rotation of said nozzle with said driving mechanism, and, when recognizing an electronic part larger than the visual field size of camera, for changing a plurality of times the posture of said electronic part held by said nozzle with said rotary driving member, and recognizing the electronic part from partial recognized images of said electronic part obtained from said camera every time the posture is changed.

4. The electronic parts mounting apparatus as set forth in claim 3, wherein, when either one of the center of visual field of the recognition camera and the center of rotation of the nozzle is determined to be a reference for the driving mechanism, its driving direction is limited to one fixed direction.

5. The electronic parts mounting apparatus as set forth in claim 3, wherein calculation means is added for calculating a location for movement of the recognition camera from previously registered data on the center of rotation of the nozzle, and the driving mechanism moves the recognition camera to the location for movement calculated by said calculation means.

6. The electronic parts mounting apparatus as set forth in claim 3, wherein calculation means is added for calculating a location for movement of the recognition camera from previously registered sizes of electronic parts, and the driving mechanism moves the recognition camera to the location for movement calculated by said calculation means.

7. An electronic parts mounting method using an electronic parts recognition mechanism rotating an electronic part held by a nozzle, capturing an image of the electronic part by a recognition camera fixed at a position, and collecting a plurality of thus captured images into a composite image, said method comprising the steps of:
   (a) capturing an image of the electronic part by the recognition camera;
   (b) rotating the nozzle holding the electronic part for a certain amount and thereafter capturing a posture image of the electronic part;
   (c) repeating step b) once or a plurality of times; and
   (d) recognizing the contour of the entire electronic part by processing each of the captured images into a composite image.

8. An electronic parts mounting method as set forth in claim 7 wherein during step (d) of recognizing the contour of the entire electronic part, the amount of offset of the center of the electronic part from the center of the image is detected, thereby correcting the mounting of the electronic part.

9. An electronic parts mounting method using an electronic parts recognition mechanism rotating an electronic part held by a nozzle, capturing an image of the electronic part by a recognition camera selected from two recognition cameras fixed at different positions apart from each other by a certain distance, and collecting a plurality of thus captured images into a composite picture, said method comprising the steps of:

comparing the size of the electronic part and the size of visual field of the camera;

when the size of the electronic part is smaller than that of the visual field of the camera, switching on the first recognition camera with which the center of visual field of the camera and the center of rotation of the nozzle correspond to each other, thereby performing a batch recognition of the electronic part; and     when the size of the electronic part is larger than that of the visual field of the camera, switching on the second recognition camera with which the center of visual field of the camera and the center of rotation of the nozzle differ from each other, and each time when the nozzle holding the part is rotated for a certain amount, dividing the image of the electronic part and capturing the divided images into a composite picture, thereby recognizing the contour of the entire electronic part.

10. An electronic parts mounting method using an electronic parts recognition mechanism rotating an electronic part held by a nozzle, capturing an image of the electronic part by a recognition camera, collecting a plurality of thus captured images into a composite image, and a drive mechanism for varying a relative positional relation between the center of visual field of the recognition camera and the center of rotation of said nozzle, said method comprising the steps of:

comparing the size of the electronic part and the size of visual field of the camera;

when the size of the electronic part is smaller than that of the visual field of the camera, performing a batch recognition by actuating the drive mechanism such that the center of visual field of the camera and the center of rotation of the nozzle correspond to each other; and     when the size of the electronic part is larger than that of the visual field of the camera, dividing the image of the electronic part and capturing the divided images into a composite image each time the nozzle holding the part is rotated for a certain amount, while the drive mechanism is being actuated such that the center of visual field of the recognition camera and the center of rotation of the nozzle differ from each other by a certain distance, thereby recognizing the contour of the entire electronic part.

* * * * *